(12) United States Patent
Tahara et al.

(10) Patent No.: US 7,030,170 B2
(45) Date of Patent: Apr. 18, 2006

(54) PHOTOSENSITIVE RESIN COMPOSITION, DRY FILM, AND WORKPIECE USING THE SAME

(75) Inventors: Syuji Tahara, Sodegaura (JP); Etsuo Ohkawado, Sodegaura (JP); Moritsugu Morita, Sodegaura (JP); Kazuhito Fujita, Sodegaura (JP); Takeshi Tsuda, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 119 days.

(21) Appl. No.: 10/301,731

(22) Filed: Nov. 22, 2002

(65) Prior Publication Data

US 2003/0176528 A1 Sep. 18, 2003

(30) Foreign Application Priority Data

Nov. 22, 2001 (JP) .................................... 2001-357436
Apr. 30, 2002 (JP) .................................... 2002-128328

(51) Int. Cl.
  *C08F 2/46* (2006.01)
  *G03F 7/039* (2006.01)

(52) U.S. Cl. ...................... 522/76; 522/74; 522/134; 522/135; 522/142; 522/144; 522/149; 522/151; 522/152; 522/164; 522/173; 522/176; 522/182; 430/270.1; 430/280.1; 430/283.1; 430/286.1; 430/906; 428/473.5

(58) Field of Classification Search ............. 522/74, 522/76, 134, 135, 142, 144, 149, 151, 152, 522/164, 173, 176, 182; 524/514, 506, 507; 525/180, 183; 428/473.5; 430/270.1, 280.1, 430/283.1, 286.1
See application file for complete search history.

(56) References Cited

U.S. PATENT DOCUMENTS 6,214,923 B1 * 4/2001 Goto et al. ................. 524/514
6,541,178 B1 * 4/2003 Jung et al. ............... 430/270.1

FOREIGN PATENT DOCUMENTS

| JP | 56-40329 B2 | 9/1981 |
| JP | 59-160140 A | 9/1984 |
| JP | 61-170731 A | 8/1986 |
| JP | 61-243869 A | 10/1986 |
| JP | 64-002037 A | 1/1989 |
| JP | 05-158237 A | 6/1993 |

* cited by examiner

*Primary Examiner*—James J. Seidleck
*Assistant Examiner*—Sanza L. McClendon
(74) *Attorney, Agent, or Firm*—Buchanan Ingersoll PC

(57) ABSTRACT

A photosensitive resin composition which contains (A) polyamic acid, (B) (meth)acrylate having at least two photopolymerizable C═C unsaturated double bonds, (C) a photopolymerization initiator and (D) a flame retardant, with the (meth)acrylate (B) having at least two photopolymerizable C═C unsaturated double bonds being contained in an amount of 10 to 700 parts by weight based on 100 parts by weight of the polyamic acid (A).

7 Claims, No Drawings

PHOTOSENSITIVE RESIN COMPOSITION, DRY FILM, AND WORKPIECE USING THE SAME

FIELD OF THE INVENTION

The present invention relates to a photosensitive resin composition containing polyamic acid as a main component, a dry film obtained from the composition and a workpiece using the dry film. More particularly, the invention relates to a photosensitive resin composition capable of producing a dry film for solder resist that is used as a cover-lay material of a flexible printed circuit board (sometimes referred to as "FPC" hereinafter), a dry film for solder resist capable of forming a solder resist coating film which is curable with low energy, has fine resolution and exhibits excellent extension properties, heat resistance, flame resistance, adhesion and electrical properties and a workpiece obtained by the use of the dry film.

BACKGROUND OF THE INVENTION

In the conventional production of printed circuit boards, an etching resist pattern or a plating resist pattern is formed by screen printing, and then etching or plating of a metallic foil is carried out to form a desired conductive circuit pattern. For the purpose of prevention of oxidation of the conductive circuit pattern or maintenance of the insulating properties, a coating film of desired shape is formed on the conductive circuit pattern using a thermosetting resin composition or a photo-curing resin composition by the same screen printing as in the formation of the conductive circuit.

Recently, fining of the conductive circuit pattern, improvement of the alignment accuracy, and besides, miniaturization of mounting parts and pitch-fining of lead of IC package have been promoted, and therefore there has been required improvement of image accuracy and alignment accuracy also in the formation of insulating coating films such as solder resist coating films. On this account, as a process capable of forming a coating film with high accuracy, a process comprising using a photo-curing resin composition to form a solder resist coating film or an insulating coating film (photo process) has been widely adopted in recent years.

In the photo process, it is general that a photosensitive resin composition is applied onto a substrate to give a coating of desired size, then the coating is dried to form a photosensitive coating film, on the photosensitive coating film is placed a negative photo mask, and exposure to active rays such as ultraviolet rays and development are carried out. The photosensitive coating film is cured with active rays transmitted by the transparent portion of the photo mask, and the unexposed portion is removed by a developing solution. The photosensitive coating film formed by the above process is further cured with heat or active rays and becomes a solder resist coating film or an insulating coating film. In this process, an image can be formed with an accuracy extremely close to the photo mask, so that a fine image or high alignment accuracy can be readily obtained.

In the above process, however, a step of applying the photosensitive resin composition onto a substrate surface and a step of drying the coating to remove the solvent are necessary, as described above. In the actual circumstances, therefore, the process of FPC production becomes complicated, and it is worrisome to reduce proportion defective caused by pinholes or foreign matters. In the developing step, the uncured portion of the unexposed area is removed by dissolving it in an organic solvent, and as the solvent, a solvent of high toxicity such as 1,1,1-trichlroethane or a combustible solvent is used. Accordingly, a photo solder resist using an incombustible and low-toxicity solvent such as an alkali aqueous solution has been desired from the viewpoint of working safety.

In recent years, therefore, studies of alkali aqueous solution developing type photo solder resists have been actively made, and some compositions are disclosed. For example, in Japanese Patent Publication No. 40329/1981, a photosensitive resin composition containing as a base polymer a reaction product obtained by adding an unsaturated monocarboxylic acid to an epoxy resin and further adding a polybasic acid anhydride to the resulting product is disclosed. In Japanese Patent Laid-Open Publication No. 243869/1986, a photo solder resist composition containing as a base polymer a reaction product obtained by adding a polybasic acid anhydride to a novolak epoxy acrylate or the like and using an alkali aqueous solution as a developing solution is disclosed. However, solder resist coating films obtained from the above compositions are insufficient in the heat resistance, solvent resistance and chemical resistance, and besides it cannot be said that they are satisfactory in the insulating properties and properties relating to dielectric constant. Moreover, because of their poor flexibility and flexing properties, these films cannot be applied to flexible circuit boards such as FPC.

On the other hand, polyimide obtained by heating polyamic acid that Is a precursor of polyimide has been used for IC protective films or layer insulating films because of its excellent heat resistance, chemical resistance, dielectric properties, etc., and a photosensitive polyimide precursor capable of directly forming a pattern through exposure and development has been proposed (Japanese Patent Laid-Open Publication No. 160140/1984, Japanese Patent Laid-Open Publication No. 158237/1993). For polyimide varnish obtained by dissolving polyamic acid in a solvent, however, a high-boiling point solvent having high polarity is usually used, and the solids concentration of the varnish cannot be increased, so that the drying time is prolonged, resulting in a problem of high processing cost. In Japanese Patent Laid-Open Publication No. 170731/1986 and Japanese Patent Laid-Open Publication No. 2037/1989, examples of dry films obtained from photosensitive polyimide precursors are described. However, the production of those films is complicated and the quality control is difficult, so that the cost becomes high. Further, imidation is difficult unless a temperature of not lower than 300° C. is applied, and besides there has been pointed out a disadvantage that even if imidation is carried out, the resulting resin exhibits low extensibility. Moreover, the photosensitive acrylate that is compatible with the polyamic acid is restricted and quantitative blending is infeasible, so that it is difficult to improve resolution. Therefore, such precursors are thought to be disadvantageous particularly for forming thick films.

OBJECT OF THE INVENTION

It is an object of the present invention to provide a photosensitive resin composition, which can form a fine image by exposure of low energy, which can be developed with an alkali aqueous solution such as a sodium hydroxide aqueous solution or a sodium carbonate aqueous solution without using an organic solvent and from which a coating film exhibiting excellent heat resistance, flame resistance, adhesion to conductor and electrical properties with retaining good flexibility and flexing properties can be obtained through development and heat treatment (imidation). It is another object of the invention to provide a dry film obtained from the photosensitive resin composition. It is a further object of the invention to provide a workpiece having a coating film that is formed by laminating and curing the dry film.

SUMMARY OF THE INVENTION

According to the present invention, the following photosensitive resin composition, dry film and workpiece using the dry film are obtained, and the above objects are attained.

(I) A photosensitive resin composition comprising:

(A) polyamic acid, (B) (meth)acrylate having at least two photopolymerizable C=C unsaturated double bonds, (C) a photopolymerization initiator, and (D) a flame retardant, wherein the (meth)acrylate (B) having at least two photopolymerizable C=C unsaturated double bonds is contained in an amount of 10 to 700 parts by weight based on 100 parts by weight of the polyamic acid (A)

(II) The photosensitive resin composition of (I), wherein the polyamic acid (A) comprises a constituent unit represented by the following formula (1):

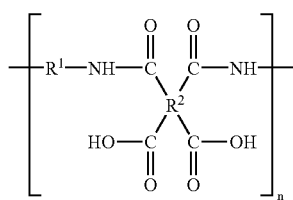

wherein n is an integer of 1 to 100, $R^1$ is a divalent organic group consisting of only elements selected from C, H and O, and $R^2$ is a tetravalent organic group consisting of only elements selected from C, H and O, and has the following properties:

the dielectric constant, as determined by the Clausius-Mosotti's formula that is represented by the following formula (2), is in the range of 3 to 5, $$\text{Dielectric constant } (\in)=(1+2\cdot Pm/Vm)/(1-Pm/Vm) \quad (2)$$

wherein Pm is a molar polarizability, and Vm is a molar volume, the viscosity (solvent: N,N-dimethylacetamide, concentration: 30% by weight, measured at 25° C.) is in the range of 0.5 to 30.0 Pa·s, and the amic acid content in the constituent units is in the range of 15 to 40% by weight.

(III) The photosensitive resin composition of (I), wherein the (meth)acrylate (B) having at least two photopolymerizable C=C unsaturated double bonds comprises a bi- or more-functional (meth)acrylate compound having an alcoholic hydroxyl group and a polyalkylene glycol di(meth) acrylate compound, and based on 100 parts by weight of the polyamic acid (A), the bi- or more-functional (meth)acrylate compound having an alcoholic hydroxyl group is contained in an amount of 5 to 200 parts by weight and the polyalkylene glycol di(meth) acrylate compound is contained in an amount of 10 to 500 parts by weight.

(IV) The photosensitive resin composition of (III), wherein the polyalkylene glycol di(meth)acrylate compound is a compound represented by the following formula (3):

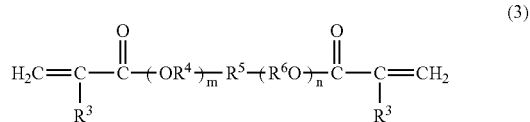

wherein $R^3$ is a hydrogen atom or a methyl group, $R^4$ and $R^6$ are each an aliphatic group of 2 to 5 carbon atoms, $R^5$ is an aromatic group having two or more benzene rings or a single bond, n and m are each an integer of 1 or greater, and n+m is 2 to 12.

(V) The photosensitive resin composition of (I), wherein the flame retardant (D) is an addition product of an organic phosphorus compound represented by the following formula (4), (5) or (6):

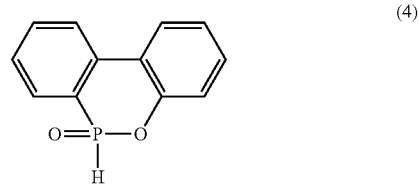

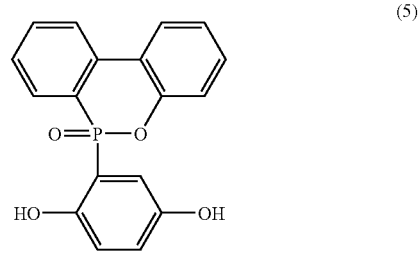

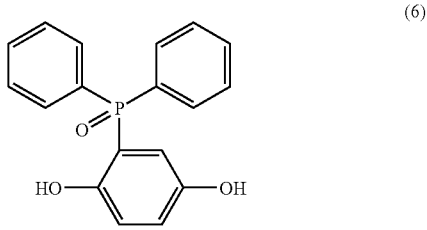

with at least one compound selected from a compound having 1 to 4 epoxy groups, a compound having 1 to 4 (meth)acrylic groups and a compound having 1 to 4 vinyl groups.

(VI) A dry film obtained from any one of the photosensitive resin compositions of (I) to (V).

(VII) The dry film of (VI), which has a phosphorus content of 0.5 to 6.0% by weight based on the weight of the dry film.

(VIII) The dry film of (VI), which has a viscosity, at 40 to 120° C., of 50 to 50000 Pa·s.

(IX) A workpiece comprising a flexible printed circuit board and a polyimide coating film formed thereon, said coating film being obtained from the dry film of (VI).

DETAILED DESCRIPTION OF THE INVENTION

The photosensitive resin composition according to the invention, the dry film and the workpiece using the dry film are described in detail hereinafter.

The photosensitive resin composition according to the invention comprises:

(A) polyamic acid, (B) (meth)acrylate having at least two photopolymerizable C=C unsaturated double bonds, (C) a photopolymerization initiator, and (D) a flame retardant.

The components constituting the photosensitive resin composition are described below in detail.

(A) Polyamic Acid

The polyamic acid (A) for use in the invention preferably comprises a constituent unit (sometimes referred to as a "polyamic acid unit" hereinafter) represented by the following formula (1):

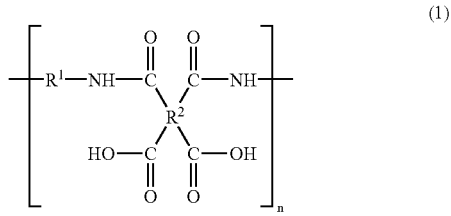
(1)

wherein n is an integer of 1 to 100, $R^1$ is a divalent organic group consisting of only elements selected from C, H and O, and $R^2$ is a tetravalent organic group consisting of only elements selected from C, H and O.

The divalent organic group preferable as $R^1$ is, for example, a group represented by the following formula (7-1) or (7-2).

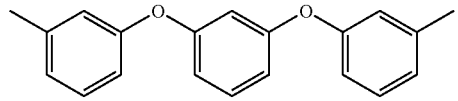
(7-1)

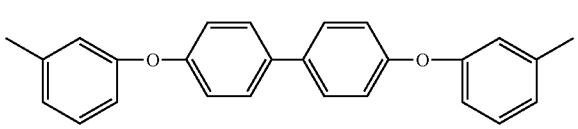
(7-2)

The tetravalent organic group preferable as $R^2$ is, for example, a group represented by the following formula (8-1) or (8-2).

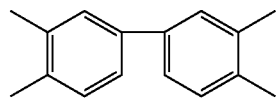
(8-1)

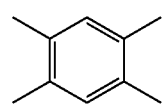
(8-2)

The polyamic acid (A) for use in the invention desirably has a dielectric constant of 3 to 5, preferably 3.3 to 4.7.

When the dielectric constant of the polyamic acid unit is not less than the lower limit of the above range, adhesion between a polyimide coating film obtained from a solder resist dry film and FPC is excellent. When the dielectric constant is not more than the upper limit of the above range, compatibility of the polyamic acid with the (meth)acrylate (B) can be retained, and a polyimide coating film obtained from a solder resist dry film tends to have excellent flexibility.

The dielectric constant is determined by the Clausius-Mosotti's formula that is represented by the following formula (2):

$$\text{Dielectric constant } (\in) = (1+2 \cdot Pm/Vm)/(1-Pm/Vm) \quad (2)$$

wherein Pm is a molar polarilizability, and Vm is a molar volume.

The polyamic acid (A) for use in the invention has an amic acid content, in the constituent units, of 15 to 40% by weight, preferably 25 to 35% by weight.

When the amic acid content is not less than 15% by weight, a coating film obtained from the photosensitive resin composition can attain high Tg. When the amic acid content is not more than 40% by weight, compatibility of polyimide obtained from the polyamic acid (A) with an acrylic polymer obtained from the (meth)acrylate (B) can be retained, and a coating film obtained from the photosensitive resin composition has excellent flexibility.

In the present invention, the polyamic acid (A) preferably has a dielectric constant and an amic acid content of 3 to 5 and 15 to 40% by weight, respectively, and particularly preferably has a dielectric constant and an amic acid content of 3.3 to 4.7 and 25 to 35% by weight, respectively.

The term "amic acid content" used herein means amounts (% by weight) of

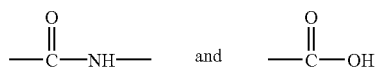

occupied in the constituent units.

If the amic acid content varies, the polarity is greatly changed, so that the compatibility of the polyamic acid with the (meth)acarylate (B) and the flame retardant (D) is changed. That is to say, the (meth)acarylate (B) and the flame retardant (D) compatible with the polyamic acid (A) are restricted.

A feature of the present invention is that the polyimide and the acrylic polymer form a polymer alloy to thereby make the most of merits of the polyimide and merits of the acrylic polymer and acquirement of such compatibility as mentioned above becomes one of key technique of the present invention.

The polyamic acid (A) comprising the polyamic acid units and having a dielectric constant of the above range and an amic acid content of the above range can be prepared by, for example, subjecting an aromatic diamine represented by the following formula (7-1') or (7-2') and an aromatic acid dianhydride represented by the following formula (8-1') or (8-2') to addition polymerization in an organic solvent.

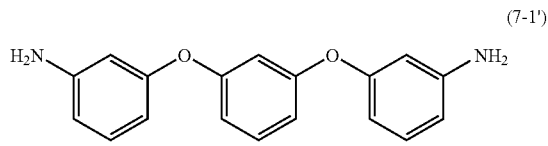
(7-1')

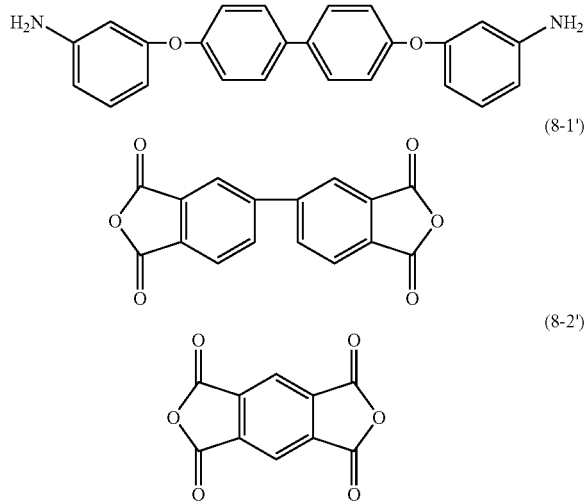

(7-2')

(8-1')

(8-2')

In the present invention, aromatic diamines other than the aromatic diamine represented by the formula (7-1') or (7-2') can be employed. Examples of such aromatic diamines include 3,3'-diaminodiphenyl ether, 4,4'-diamino-3,3',5,5'-tetramethyldiphenylmethane, 4,4'-diamino-3,3'-diethyl-5,5'-dimethyldiphenylmethane, 4,4'-diaminodiphenyl-2,2'-propane, 4,4'-diaminodiphenylmethane, 3,4'-diaminobanzanilide, 4,4'-diaminobenzanilide, 3,3'-diaminobenzophenone 4,4'-diaminobenzophenone, 3,3'-diethyl-4,4'-diaminodiphenyl ether, 3,3'-diethoxy-4,4'-diaminodiphenylmethane, 3,3'-dimethyl-4,4'-diaminodiphenylmethane, 3,3'-dimethyl-4,4'-diaminodiphenylpropane, 3,3'-diethyl-4,4'-diaminodiphenylpropane, 3,3'-dimethyl-5,5'-diethyl-4,4'-diaminodiphenylmethane, 3,3'-dimethoxy-4,4'-diaminodiphenyl ether, 3,3'-dimethoxy-4,4'-diaminodiphenylmethane, 3,3'-dimethoxy-4,4'-diaminodiphenylsulfone, 3,3'-dimethoxy-4,4'-diaminodiphenylpropane, 3,3'-diethoxy-4,4'-diaminodiphenylpropane, 3,3',5,5'-tetramethyl-4,4'-diaminodiphenylmethane, 3,3',5,5'-tetraethyl-4,4'-diaminodiphenylmethane, 4,4'-bis(4-aminophenoxy)biphenyl, 1,3-bis(4-aminophenoxy)benzene, 1,4-bis(4-aminophenoxy)benzene, bis [4-(4-aminophenoxy)phenyl]ether and 2,2'-bis[4-(4-aminophenoxy)phenyl]propane.

These aromatic diamines other than the aromatic diamine represented by the formula (7-1') or (7-2') can be used when the polyamic acid (A) obtained by the use of these aromatic diamines satisfies the aforesaid dielectric constant.

In the present invention, aromatic acid dianhydrides other than the aromatic acid dianhydride represented by the formula (8-1') or (8-2') can be employed. Examples of such aromatic acid dianhydrides include 1,2,5,6-naphthalenetetracarboxylic dianhydride, 2,3,6,7-naphthalenetetracarboxylic dianhydride, 1,4,5,6-naphthalenetetracarboxylic dianhydride, 1,1-bis(2,3-dicarboxyphenyl)ethane dianhydride, 2,2-bis(2,3-dicarboxyphenyl)ethane dianhydride, 2,2-bis(3,3-dicarboxyphenyl)ethane dianhydride, 2,2-bis[4-(3,4-dicarboxyphenoxy)phenyl]propane dianhydride, 3,3',4,4'-biphenylethertetracarboxylic dianhydride, 2,3,3',4'-biphenylethertetracarboxylic dianhydride, 2,3,5,6-pyridinetetracarboxylic dianhydride, pyromellitic dianhydride, 3,4,9,10-perylenetetracarboxylic dianhydride, 2,3,3',4'-benzophenonetetracarboxylic dianhydride and 3,3',4,4'-benzophenonetetracarboxylic dianhydride.

These aromatic acid dianhydrides other than the aromatic acid dianhydride represented by the formula (8-1') or (8-2') can be used when the polyamic acid (A) obtained by these aromatic acid dianhydrides satisfies the aforesaid dielectric constant.

In the polymerization reaction of the aromatic diamine with the aromatic acid dianhydride, the reaction temperature is in the range of usually 10 to 60° C., preferably 20 to 50° C., and the pressure is not specifically restricted. Although the reaction time depends upon the type of the organic solvent used and the reaction temperature, the period of time enough for the completion of the reaction is usually in the range of 4 to 24 hours.

The polyamic acid solution (polyamic acid (A)) obtained as above desirably has a viscosity of 0.5 to 30.0 Pa·s, preferably 10.0 to 20.0 Pa·s. The term "viscosity" used herein is a value measured at 25° C. using an EH type viscometer (manufactured by Toki Sangyo) 3° cone.

When the viscosity of the polyamic acid solution is not less than 0.5 Pa·s, the exposed portion tends to have sufficiently high film strength, and a high resolution tends to be obtained. When the viscosity is not more than 30.0 Pa·s, compatibility of the polyamic acid with the (meth)acrylate (B) is excellent, and because of good solubility of the unexposed portion in the alkali solution in the developing process, a high resolution tends to be obtained. This logarithmic viscosity can be arbitrarily controlled by changing the molar ratio between the aromatic diamine and the aromatic acid dianhydride.

The content of the polyamic acid (A) in the photosensitive resin composition is in the range of 10 to 95% by weight, preferably 30 to 70% by weight, in terms of solids content. When the content is not less than 10% by weight, solubility of the coating film in the alkali solution after the exposure is improved, and a high resolution can be obtained. Moreover, the finally cured film can exhibit heat resistance, chemical resistance and electrical insulating properties, which are merits of polyimide. By adjusting the content of the polyamic acid (A) to not more than 95% by weight and by securing the content of the (meth)acrylate (B), photosensitivity is exhibited, and as a result, curing with energy rays such as UV rays becomes feasible and formation of fine pattern by light becomes feasible.

(B) (Meth)Acrylate Having at Least Two Photopolymerizable C=C Unsaturated Double Bonds Examples of the (meth)acrylates (B) having at least two photopolymerizable C=C unsaturated double bonds, which are employable in the invention, include the below-described (meth)acrylate compounds having an alcoholic hydroxyl group and having at least two photopolymerizable C=C unsaturated double bonds, polyalkylene glycol di(meth)acrylate compounds and other (meth)acrylate compounds.

The (meth)acrylate compound (B) is used in an amount of 10 to 700 parts by weight, preferably 30 to 250 parts by weight, based on 100 parts by weight of the polyamic acid (A).

(Meth)Acrylate Compound Having Alcoholic Hydroxyl Group and Having at Least Two Photopolymerizable C=C Unsaturated Double Bonds Examples of the (meth)acrylate compounds having an alcoholic hydroxyl group and having at least two photopolymerizable C=C unsaturated double bonds include pentaerythritol triacrylate, pentaerythritol trimethacrylate, dipentaerythritol pentaacrylate, dipentaerythritol pentamethacrylate, tetramethylolpropane triacrylate, tetramethylolpropane trimethacrylate, tris(hydroxyethylacryloyl)

isocyanurate, tris(hydroxyethylmethacryloyl)isocyanurate, isocyanuric triacrylate and isocyanuric trimethacrylate.

These (meth)acrylate compounds having an alcoholic hydroxyl group and having at least two photopolymerizable C=C unsaturated double bonds can be used singly or in combination of two or more kinds.

These compounds have excellent compatibility with the polyamic acid (A) and are used to control curing properties in the exposure and developing properties.

The content of the (meth)acrylate compound having an alcoholic hydroxyl group and having at least two photopolymerizable C=C unsaturated double bonds is in the range of 0 to 200 parts by weight, preferably 5 to 200 parts by weight, more preferably 10 to 50 parts by weight, based on 100 parts by weight of the polyamic acid (A). By adjusting the content to not more than 200 parts by weight, solubility of the unexposed portion in the alkali solution in the developing process can be retained, and the flexibility of the cured product after imidation is not impaired.

Polyalkylene Glycol Di(Meth)Acrylate Compound

The polyalkylene glycol di(meth)acrylate compound is, for example, a compound represented by the following formula (3) This compound can be used singly or in combination of two or more kinds.

This compound has excellent compatibility with amic acid and is used to control curing properties in the exposure and developing properties.

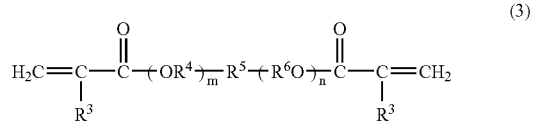

(3)

wherein $R^3$ is a hydrogen atom or a methyl group, $R^4$ and $R^5$ are each an aliphatic group of 2 to 5 carbon atoms, $R^5$ is an aromatic group having two or more benzene rings or a single bond, n and m are each an integer of 1 or greater, and n+m is 2 to 12.

In the above compound, $R^4$ and $R^6$ are each preferably an aliphatic group of 2 to 4 carbon atoms, such as an ethylene group, a propylene group, a 1-butylene group or a 2-butylene group. By restricting the number of carbon atoms to 2 to 4, proper water solubility can be retained, and good compatibility with the polyamic acid (A) can be exhibited.

In the above formula, $R^5$ is an aromatic group having two or more benzene rings or a single bond, and examples of such groups include residues of compounds such as bisphenol A, bisphenol S, methylenebisphenol, 4,4'-ethylidenebisphenol, biphenol 4,4'-oxybisphenol, 1,1'-biphenyl-4,4'-diol, 4,4'-cyclohexylylenebisphenol, 4,4'-(1-phenylethylidene)bisphenol, bis(4-hydroxyphenyl)methanone, 4,4'-(phelmethylene)bisphenol and 5,5'-(1,1'-cyclohexylidene)bis[1,1'-(biphenyl)-2-ol]. By restricting the number of benzene rings to two or more, chemical resistance can be improved with retaining hydrophilic properties.

The content of the polyalkylene glycol di(meth)acrylate compound is in the range of 10 to 500 parts by weight, preferably 20 to 200 parts by weight, based on 100 parts by weight of the polyamic acid (A). When the compound is contained in an amount of not less than 10 parts by weight, compatibility of the compound with the amic acid is improved, and resolution is also improved. Moreover, flexibility of the cured product after imidation is improved, and high extensibility can be obtained with retaining high Tg. By restricting the content to not more than 500 parts by weight, a cured film having merits of polyimide can be obtained, and the film can exhibits chemical resistance and high electrical insulating properties Other (Meth)Acrylate Compounds In the present invention, the following compounds can be optionally used in combination as the (meth)acrylate compound (B).

For example, there can be used 1,6-hexanediol di(meth)acrylate, N,N'-methylenebis(meth)acrylate, neopentyl glycol di(meth)acrylate, pentaerythritol tetra(meth)acrylate, trimethylopropane tri(meth)acarylate, 1,3,5-tri(meth)acryloylhexahydro-S-triazine, tris{hydoxyethyl(meth)acryloyl}isocyanurate, tri(meth)acrylformal, tetramethylolpropane tetra(meth)acrylate and tetramethylolmethane tetra(meth)acryalte.

These compounds can be used in any amount capable of being dissolved in the polyamic acid (A), and the amount is usually in the range of 0 to 90 parts by weight based on 100 parts by weight of the polyamic acid (A).

(C) Photopolymerization Initiator

Examples of the photopolymerization initiators (C) employable in the invention include benzophenone, Michler's ketone, benzoin, benzoin ethyl ether, benzoin butyl ether, benzoin isobutyl ether, 2,2-dimethoxy-2-phenylacetophenone, 2-hydroxy-2-phenylactophenone, 2-hydroxy-2-methylpropiophenone, 2-hydroxy-4-isopropyl-2-methylpropiophenone, 2-ethylanthraquinone, 2-t-butylanthraquinone, diethylthioxanthone, chlorothioxanthone, benzyl, benzyldimethylketal, 1-hydroxycyclohexyl phenyl ketone, benzoylbenzoic acid, 2-methyl-1-(4-methylthiphenyl)-2-morpholinopropane-1-one and 2,4,6-trimethylbenzoyldiphenylphosphine oxide.

Also available are an equimolar addition product of benzoin with ethylene oxide, a 2 to 4 times mol addition product thereof, an equimolar addition product of benzoin with propylene oxide, a 2 to 4 times mol addition product thereof, α-allylbenzoin, an equimolar addition product of 1-hydroxycyclohexyl phenyl ketone with ethylene oxide, a 2 to 4 times mol addition product thereof, an equimolar addition product of 1-hydroxycyclohexyl phenyl ketone with propylene oxide, a 2 to 4 times mol addition product thereof, an equimolar addition product of benzoylbenzoic acid with ethylene oxide, a 2 to 4 times mol addition product thereof, an equimolar addition product of benzoylbenzoic acid with propylene oxide, a 2 to 4 times mol addition product thereof, an equimolar addition product of hydroxybenzophenone with ethylene oxide, a 2 to 4 times mol addition product thereof, an equimolar addition product of hydroxybenzophenone with propylene oxide, a 2 to 4 times mol addition product thereof, 4-(2-hydroxyethoxy)-phenyl-(2-hydroxy-2-propyl)ketone, 4-(2-acryloxyethoxy)-phenyl-(2-hydroxy-2-propyl)ketone, an equimolar addition product of 4-(2-hydroxyethoxy)-phenyl-(2-hydroxy-2-propyl) ketone with ethylene oxide, a 2 to 4 times mol addition product thereof, an equimolar addition product of 4-(2-hydroxyethoxy)-phenyl-(2-hydroxy-2-propyl)ketone with propylene oxide, a 2 to 4 times mol addition product thereof, 1-(4-isopropylphenyl)-2-hydroxy-2-methylpropane-1-one, and 1-(4-decylphenyl)-2-hydroxy-2-methylpropane-1-one. These photopolymerization initiators can be used singly or as a mixture or two or more kinds.

For the purpose of increasing polymerization efficiency, a photopolymerization initiating assistant may be used in combination. Examples of the photopolymerization initiating assistants include triethanolamine, diethanolamine, monoethanolamine, tripropanolamine, dipropanolamine, monopropanolamine and isoamyl 4-dimethylaminobenzoate. These photopolymerization initiating assistants can be used singly or as a mixture or two or more kinds.

The content of the photopolymerization initiator and the content of the photopolymerization initiating assistant in the photosensitive resin composition are in the ranges of 0.05 to 15% a by weight and 0.05 to 5% by weight, respectively, preferably 0.5 to 7% by weight and 0.5 to 3% by weight, respectively, in terms of solids content By adding them in amounts of not less than 0.1% by weight, such a cure degree as provides desired resolution can be obtained. By adding them in amounts of not more than 20% by weight, the degree of polymerization of the (meth)acrylate (B) can be properly adjusted, whereby resolution and flexibility can be controlled.

(D) Flame Retardant

As the flame retardant for the invention, any flame retardant that is compatible with the polyamic acid solution may be used. For example, a phosphorus type flame retardant and a halogen type flame retardant are employable. Of these, the phosphorus type flame retardant is preferable.

Phosphorus Type Flame Retardant

The phosphorus type flame retardant more preferably used is, for example, a flame retardant wherein an organic phosphorus compound is bonded to at least one compound selected from a compound having 1 to 4 epoxy groups, a compound having 1 to 4 (meth)acrylic groups and a compound having 1 to 4 vinyl groups directly or through another compound.

Preferred examples of the phosphorus type flame retardants include:

an equimolar addition product of a compound having 1 to 4 epoxy groups, a compound having 1 to 4 (meth)acrylic groups or a compound having 1 to 4 vinyl groups with an organic phosphorus-containing compound represented by the following formula (4):

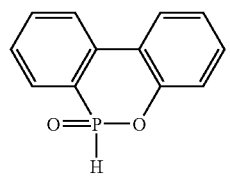

(4)

an equimolar addition product of a compound having 1 epoxy group, a compound having 1 (meth)acrylic group or a compound having 1 vinyl group with an organic phosphorus-containing compound represented by the following formula (5):

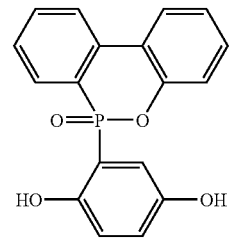

(5)

and
an equimolar addition product of a compound having 1 epoxy group, a compound having 1 (meth)acrylic group or a compound having 1 vinyl group with an organic phosphorus-containing compound represented by the following formula (6):

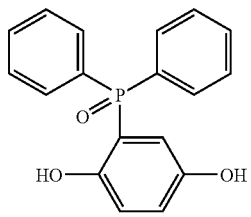

(6)

Owing to bonding of an organic phosphorus-containing compound to at least one compound selected from a compound having 1 to 4 epoxy groups, a compound having 1 to 4 (meth)acrylic groups and a compound having 1 to 4 vinyl groups directly or through another compound, the flame retardant does not undergo hydrolysis at high temperature and high humidity, and therefore catalytic secondary reaction due to hydrolyzed phosphoric acid does not take place, so that resin properties initially designed can be stably exhibited.

Examples of the compounds having 1 to 4 epoxy groups include the following compounds.

Compound Having 1 Epoxy Group

As the compound having 1 epoxy group, any compound may be used provided that the compound is monodiglycidyl ether obtained by glycidylation of phenols.

Examples of the phenols include phenol, o-cresol, m-cresol, p-cresol, resorcinol, hydroquinone, catechol, bisphenol A, biphenol, 4,4'-oxybisphenol, bis(4-hydroxyphenyl)methanone, 4,4'-ethylidenebisphenol, 4,4'-cyclohexylylenebisphenol, 4,4'-(phenylmethylene)bisphenol, o-phenylphenol, m-phenylphenol, p-phenylphenol, o-ethylphenol, m-ethylphenol, p-ethylphenol, o-isopropylphenol, o-methoxyphenol, m-methoxyphenol, 2,4-xylenol, 2,6-xylenol, p-methoxyphenol, α-naphthol and β-naphthol. Also employable are phenol(ethylene oxide n mol addition) glycidyl ether, p-tert-butylphenyl glycidyl ether, butyl glycidyl ether, allyl glycidyl ether, vinyl glycidyl ether, glycidyl (meth)acryalte, N-glycidyl phthalimide and dibromophenyl glycidyl ether. These phenols can be used singly or in combination of two or more kinds.

Compound Having 2 Epoxy Groups

As the compound having 2 epoxy groups, any compound may be used provided that the compound is diglycidyl ether obtained by glycidylation of divalent phenols or aromatic amines.

Examples of the divalent phenols include bisphenol A, bisphenol S, methylenebisphenol, 4,4'-ethylidenebisphenol, biphenol, 4,4'-oxybisphenol, 1,1'-biphenyl-4,4'-diol, 4,4'-cyclohexylylenebisphenol, 4,4'-(1-phenylethylidene) bisphenol, bis(4-hydroxyphenyl)methanone, 4,4'-(phenylmethylene)bisphenol, 5,5'-(1,1'-cyclohexylidene) bis-[1'-(biphenyl)-2-ol], resorcinol and hydroquinone.

Examples of the aromatic amines include aniline, o-methylaniline, m-methylaniline, p-methylaniline, o-ethylaniline, m-ethylaniline, p-ethylaniline, o-propylaniline, m-propylaniline, p-propylaniline, o-phenylaniline, m-phenylaniline and p-phenylaniline.

These divalent phenols or aromatic amines can be used singly or in combination of two or more kind.

Compound Having 3 Epoxy Groups

As the compound having 3 epoxy groups, any compound may be used provided that the compound is triglycidyl ether obtained by glycidylation of trivalent phenols or aromatic aminophenols.

Examples of the trivalent phenols include 4,4',4"-methylidenetrisphenol, 4,4'-[1-[4-[1-(4-hydroxyphenyl)-1-methylethyl]phenyl]-ethylidene]bisphenol, 4,4',4"-ethylidenetrisphenol, trikis(hydroxyphenyl) ethane, trikisglycidyloxyphenylmethylethane, trikis (hydroxyphenyl)methylpropane and trisphenol-TC.

Examples of the aromatic aminophenols include o-aminophenol, m-aminophenol, p-aminophenol, and alkylated o-, m- or p-aminophenol. The term "alkylated aminophenol" means aminophenol wherein 1 to 4 groups of 1 to 4 kinds selected from methyl, ethyl, n-propyl and isopropyl are directly bonded to the benzene ring.

These trivalent phenols or aromatic aminophenols can be used singly or in combination of two or more kinds.

Compound Having 4 Epoxy Groups

As the compound having 4 epoxy groups, any compound may be used provided that the compound is tetraglycidyl ether obtained by glycidylation of tetravalent phenols or aromatic diamines.

Examples of the tetravalent phenols include 4,4',4"4'''-(1, 2ethanediylidene)tetrakis[2-methylphenol] and 4,4',4",4'''-(1,4-phenylenedimethylidene)tetrakisphenol.

Examples of the aromatic diamines include o-phenylenediamine, m-phenylenediamine, p-phenylenediamine, 1,1'-diaminodiphenylmethane, 1,2'-diaminodiphenylmethane, 1,3'-diaminodiphenylmethane, 2,2'-diaminodiphenylmethane, 2,3'-diaminodiphenylmethane and 3,3'-diaminodiphenylmethane.

These tetravalent phenols or aromatic diamines can be used singly or in combination of two or more kinds.

Examples of the compounds having 1 to 4 (meth)acrylic groups and the compounds having 1 to 4 vinyl groups include the following compounds.

Compound Having 1 (Meth)Acrylic Group or 1 Vinyl Group

Examples of the compounds having 1 (meth)acrylic group or 1 vinyl group include 2-hydroxyethyl (meth)acrylate, 2-hydroxypropyl (meth)acrylate, benzyl (meth)acrylate, phenoxyethyl (meth)acrylate, phenoxydiethylene glycol (meth)acrylate, phenoxypolyethylene glycol (meth)acrylate, methoxyethylene glycol (meth)acrylate, methoxypolyethylene glycol (meth)acrylate, β-(meth)acryloyloxyethyl hydrogenphthalate, phenyl (meth)acrylate, o-bromophenyl (meth)acrylate, m-bromophenyl (meth)acrylate, p-bromophenyl (meth)acrylate, o,m-dibromophenyl (meth)acrylate, o,p-dibromophenyl (meth)acrylate, m,p-dibromophenyl (meth)acrylate, tribromophenyl (meth)acrylate, o-bromophenylethylene glycol (meth)acrylate, m-bromophenylethylene glycol (meth)acrylate, p-bromophenylethylene glycol (meth)acrylate, o,m-dibromophenylethylene glycol (meth)acrylate, o,p-dibromophenylethylene glycol (meth)acrylate, rn,p-dibromophenylethylene glycol (meth)acrylate, tribromophenylethylene glycol (meth)acrylate, o-bromophenylpolyethylene glycol (meth)acrylate, n-bromophenylpolyethylene glycol (meth)acrylate, p-bromophenylpolyethylene glycol (meth)acrylate, o,m-dibromophenylpolyethylene glycol (meth)acrylate, o,p-dibromophenylpolyethylene glycol (meth)acrylate, m,p-dibromophenylpolyethylene glycol (meth)acrylate, tribromophenylpolyethylene glycol (meth)acrylate, 2-hydroxyethyl vinyl ether, 2-hydroxypropyl vinyl ether, benzyl vinyl ether, phenoxyethyl vinyl ether, phenoxydiethylene glycol vinyl ether, phenoxypolyethylene glycol vinyl ether, methoxyethylene glycol vinyl ether, methoxypolyethylene glycol vinyl ether, β-vinyloxyethyl hydrogenphthalate, phenyl vinyl ether, o-bromophenyl vinyl ether, m-bromophenyl vinyl ether, p-bromophenyl vinyl ether, o,m-dibromophenyl vinyl ether, o,p-dibromophenyl vinyl ether, m,p-dibromophenyl vinyl ether, tribromophenyl vinyl ether, o-bromophanylethylene glycol vinyl ether, m-bromophenylethylene glycol vinyl ether, p-bromophenylethylene glycol vinyl ether, o,m-dibromophenylethylene glycol vinyl ether, o,p-dibromophenylethylene glycol vinyl ether, m,p-dibromophenylethylene glycol vinyl ether, tribromophenylethylene glycol vinyl ether, o-bromophenylpolyethylene glycol vinyl ether, m-bromophenylpolyethylene glycol vinyl ether, p-bromophenylpolyethylene glycol vinyl ether, o,m-dibromophenylpolyethylene glycol vinyl ether, o,p-dibromophenylpolyethylene glycol vinyl ether, m,p-dibromophenylpolyethylene glycol vinyl ether and tribromophenylpolyethylene glycol vinyl ether.

These compounds having 1 (meth)acrylic group or 1 vinyl group can be used singly or in combination of two or more kinds.

Compound Having 2 (Meth)Acrylic Groups or 2 Vinyl Groups

Examples of the compounds having 2 (meth)acrylic groups or 2 vinyl groups include 1,6-hexanediol di(meth)acrylate, N,N'-methylenebis(meth)acryalte, neopentyl glycol di(meth)acryalte, ethanediol di(meth)acryalte, 2-hydroxypropanediol di(meth)acryalte, 2-hydroxypropanediol di-1-acryalte-3-methacrylate, diethylene glycol di(meth)acrylate, isopropyldiol di(meth)acrylate, isopropylene glycol di(meth)acrylate and a polyalkylene glycol di(meth)acrylate compound represented by the following formula (3).

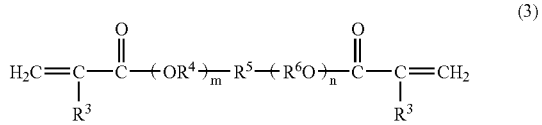

In the formula (3), $R^4$ and $R^6$ are each an aliphatic group of 2 to 4 carbon atoms, such as an ethylene group, a propylene group, a 1-butylene group or a 2-butylene group.

$R^5$ is an aromatic group having two or more benzene rings, such as a residue of bisphenol A, bisphenol S, methylenebisphenol, 4,4'-ethylidenebisphenol, biphenol, 4,4'-oxybisphenol, 1,1'-biphenyl-4,4'-diol, 4,4'-cyclohexylylenebisphenol, 4,4'-(1-phenylethylidene) bisphenol, bis(4-hydroxyphenyl)methanone, 4,4'-(phenylethylene)bisphenol or 5,5'-(1,1'-cyclohexylidene) bis-[1,1'-(biphenyl)-2-ol].

$R^3$ is hydrogen or a methyl group.

n and m are each an integer of 0 or greater, and n+m is an integer of 0 to 12.

Also employable are ethanediol divinyl ether, 2-hydroxypropanediol divinyl ether, diethylene glycol divinyl ether, isopropyldiol divinyl ether, isopropylene glycol divinyl ether, Urethane Acrylate UA-4000 (trade name, available from Shinnakamura Kagaku Kogyo), Urethane Acrylate U-108A (trade name, available from Shinnakamura Kagaku Kogyo), Urethane Acrylate U-200AX (trade name, available from Shinnakamura Kagaku Kogyo), Urethane Acrylate U-122A (trade name, available from Shinnakamura Kagaku Kogyo), Urethane Acrylate U-340AX (trade name, available from Shinnakamura Kagaku Kogyo) and a polyalkylene glycol divinyl ether compound represented by the following formula (3').

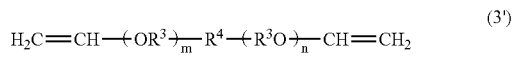

In the formula (3'), $R^3$ is an aliphatic group of 2 to 4 carbon atoms, such as an ethylene group, a propylene group, a 1-butylene group or a 2-butylene group.

$R^4$ is an aromatic group having two or more benzene rings, such as a residue of bisphenol A, bisphenol S, methylenebisphenol, 4,4'-ethylidenebisphenol, biphenol, 4,4'-oxybisphenol, 1,1'-biphenyl-4,4'-diol, 4,4'-cyclohexylylenebisphenol, 4,4'-(1-phenylethylidene) bisphenol, bis(4-hydroxyphenyl)methanone, 4,4'-(phenylethylene)bisphenol or 5,5'-(1,1'-cyclohexylidene) bis-[1,1'-(biphenyl)-2-ol].

n and m are each an integer of 0 or greater, and n+m is an integer of 0 to 12.

These compounds having 2 (meth)acrylic groups or 2 vinyl groups can be used singly or in combination of two or more kinds.

Compound Having 3 (Meth)Acrylic Groups or 3 Vinyl Groups

Examples of the compounds having 3 (meth)acrylic groups or 3 vinyl groups include pentaerythritol tri(meth) acrylate, trimethylolpropane tri(meth)acrylate, 1,3,5-tri (meth)acryloylhexahydro-S-triazine, tris(hydroxyethyl (meth) acryloyl)isocyanurate, tri(meth)acrylformal and Polyester Acrylate PA-1000 (trade name, available from Shinnakamura Kagaku Kogyo).

These compounds having 3 (meth)acrylic groups or 3 vinyl groups can be used singly or in combination of two or more kinds.

Compound Having 4 (Meth)Acrylic Groups or 4 Vinyl Groups

Examples of the compounds having 4 (meth)acrylic groups or 4 vinyl groups include pentaerythritol tetra(meth) acrylate, tetramethylolpropane tetra(meth)acrylalte, tetramethylolmethane tetra(meth)acrylalte, Polyester Acrylate PA-2000 (trade name, available from Shinnakamura Kagaku Kogyo), Urethane Acrylate U-4HA (trade name, available from Shinnakamura Kagaku Kogyo) and Urethane Acrylate U-1094A (trade name, available from Shinnakamura Kagaku Kogyo).

These compounds having 4 (meth)acrylic groups or 4 vinyl groups can be used singly or in combination of two or more kinds.

Organic phosphorus-containing compounds other than the above compounds may also be used in combination in such amounts that the properties of the solder resist coating film are not lowered Examples of the organic phosphorus-containing compounds other than the above compounds include triphenyl phosphate, tricresyl phosphate, trixylenyl phosphate, trimethyl phosphate, triethyl phosphate, tributyl phosphate, tributoxyethyl phosphate, cresyldiphenyl phosphate, 2-ethylhexyldiphenyl phosphate, triallyl phosphate, butylated triphenyl phosphate, resorcinolbisdiphenyl phosphate, bisphenol A bisdiphenyl phosphate, bisphenol A bisdicresyl phosphate and diethyl-N,N-bis(2-hydroxyethyl) aminomethyl phosphonate. These compounds can be used singly or in combination of two or more kinds.

The content of the phosphorus type flame retardant is in the range of 0.5 to 10% by weight, preferably 1 to 3% by weight, in terms of P atom in the photosensitive resin composition (solids) When the P atom content is not less than 0.5% by weight, flame retardance is exhibited. When the P atom content is not more than 10% by weight, developing properties and water resistance can be retained.

When the phosphorus type flame retardant is used, the following halogen type flame retardant can be used in combination, and the content of the halogen type flame retardant is In the range of 0 to 20% by weight, preferably 0 to 8% by weight, in terms of halogen atom in the photosensitive resin composition (solids). In this case, the halogen type flame retardant is used as an assistant of the P type flame retardant and does not serve as a main flame retardant.

Halogen Type Flame Retardant

Examples of the halogen type flame retardants include tribromoneopentyl alcohol, ethylenebistetrabromophthalimide, tetrabromophthalic anhydride, tris(tribromophenoxy)triazine, pentabromobenzyl acrylate, bis(tribromophenoxyethane), 2,4,6'-tribromophenyl methacrylate, 2,4,6-tribromophenyl acrylate, EO-modified 2,4,6-tribromophenyl methacrylate, PO-modified 2,4,6-tribromophenyl methacrylate, EO-modified 2,4,6-tribromophenyl acrylate, PO-modified 2,4,6-tribromophenyl acrylate, 2,4,6-trichlorophenyl methacrylate, dibromoneopentyl dimethacrylate, dibromopropyl acrylate, dibromopropyl methacrylate, methacrylic acid chloride, p-chlorostyrene, methyl 2-chloroacrylate, ethyl 2-chloroacrylate, n-butyl 2-chloroacrylate, tetrabromobisphenol A diacrylate, tetrabromobisphenol A dimethacrylate, EO-modified tetrabromobisphenol A diacrylate, PO-modified tetrabromobisphenol A diacrylate, EO-modified tetrabromobisphenol A dimethacrylate and PO-modified tetrabromobisphenol A dimethacrylate. These halogen type flame retardants can be used singly or in combination of two or more kinds.

The halogen type flame retardant is used, if necessary, in such an amount that the halogen atom content in the photosensitive resin composition (solids) becomes 3 to 20% by weight, preferably 5 to 12% by weight. When the content of the halogen type flame retardant is not less than the lower limit of the above range, flame retardance tends to be exhibited. When the content is not more than the upper limit of the above range, the solder resist dry film tends to be capable of retaining high resolution.

Solvent

In the photosensitive resin composition, a solvent can be used. The solvent is desired to be one in which a part or all of the components (A) to (D) are readily dissolved, but a poor solvent can be used in such an amount that the workability (including drying characteristics) and the resin properties are improved or not impaired.

The amount of the solvent used is not specifically restricted provided that the workability (including drying characteristics) and the resin properties are improved or not impaired, but the amount is in the range of preferably 30 to 90% by weight, more preferably 45 to 70% by weight based on the weight of the photosensitive resin composition. When the solvent is used in the above amount, leveling characteristics are improved in the preparation of dry film to thereby enhance qualities of the dry film.

Examples of the solvents include ketones, alcohols, ethers and acetals, esters, glycol ethers, amines, amides, and hydrocarbons.

Examples of the ketones include acetone, methyl ethyl ketone, methyl isobutyl ketone, cyclohexanone, cyclopentanone, methyl n-amyl ketone, acetonylacetone, isophorone and acetophenone. These ketones can be used singly or in combination.

Examples of the alcohols include ethyl alcohol, isopropyl alcohol, n-butanol, ethylene glycol, diethylene glycol, triethylene glycol, propylene glycol, hexylene glycol and texanol. These alcohols can be used singly or in combination.

Examples of the ethers and acetals include n-butyl ether, n-hexyl ether, ethyl phenyl ether, 1,4-dioxane, trioxane, diethyl acetal, 1,2-dioxolan, tetrahydropyran and tetrahydrofuran. These ethers and acetals can be used singly or in combination.

Examples of the esters include methyl formate, ethyl formate, propyl formate, isobutyl formate, methyl acetate, ethyl acetate, propyl acetate, n-butyl acetate, benzyl acetate, isoamyl acetate, ethyl lactate, methyl benzoate, diethyl oxalate, dimethyl succinate, dimethyl glutamate, dimethyl adipate, methyl carbonate, ethyl carbonate, propyl carbonate, butyl carbonate, ethylene glycol monomethyl ether acetate, ethylene glycol monoethyl acetate, ethylene glycol monopropyl acetate, ethylene glycol monobutyl ether acetate, ethylene glycol diacetate, propylene glycol monomethyl ether acetate, propylene glycol monoethyl ether acetate, propylene glycol monompropyl ether acetate, propylene glycol monobutyl ether acetate, propylene glycol diacetate, diethylene glycol monomethyl ether acetate, diethylene glycol monoethyl ether acetate and diethylene glycol diacetate. These esters can be used singly or in combination.

Examples of the glycol ethers include ethylene glycol monomethyl ether, ethylene glycol dimethyl ether, ethylene glycol monoethyl ether, ethylene glycol diethyl ether, ethylene glycol monobutyl ether, ethylene glycol dibutyl ether, propylene glycol monomethyl ether, propylene glycol dimethyl ether, propylene glycol monoethyl ether, propylene glycol diethyl ether, propylene glycol monobutyl ether and propylene glycol dibutyl ether. These glycol ethers can be used singly or in combination.

Examples of the amines and the amides include dimethylformamide, N,N-dimethylacetamide, N-methyl-2-pyrrolidone, pyridine and pyrazine. These amines and amides can be used singly or in combination.

Examples of the hydrocarbons include n-heptane, n-octane, n-decane, cyclohexane, benzene, toluene, xylene, ethylbenzene, diethylbenzene and pinene. These hydrocarbons can be used singly or in combination.

Other solvents such as dimethyl sulfoxide are also employable.

The solvents mentioned above may be used singly or in combination of plural kinds. For example, by the use of a mixture of a low-boiling point solvent and a high-boiling point solvent, foaming can be inhibited in the drying process, whereby qualities of the dry film can be enhanced. Further, the above solvents may be used in combination with solvents of other groups provided that the workability (including drying characteristics) and the resin properties are improved or not impaired by the combination use.

Process for Producing Dry Film

The dry film (photosensitive polyimide film) can be obtained by applying the photosensitive resin composition having been adjusted so as to have a solids content of 30 to 90% by weight onto a colorless transparent film of a given thickness, in a given coating thickness and then drying the coated layer.

Examples of materials employable for the colorless transparent film include low-density polyethylene, high-density polyethylene, polypropylene, polyester, polycarbonate, polyalylate and an ethylene/cyclodecene copolymer (trade name: APEL, available from Mitsui Chemicals, Inc.). The properties of the polyamic acid (A) vary with water content, so that desirable are resins of low moisture permeability. Of the above materials, therefore, APEL, polyethylene and polypropylene are preferable.

The thickness of the colorless transparent film is desired to be in the range of usually 15 to 100 μm, preferably 30 to 75 μm. When the thickness is in this range, the film exhibits excellent coating properties, adhesion properties, rolling properties, toughness and cost.

In the present invention, more preferable is a film of polyethylene, polypropylene or high-ethylene content APEL having a film thickness of 15 to 100 μm, preferably 30 to 75 μm, from the viewpoints of coating properties, adhesion properties, rolling properties, toughness and cost.

Application of the photosensitive resin composition onto the colorless transparent film can be carried out by a known means such as a reverse roll coater, a gravure roll coater, a comma coater or a curtain coater. Drying of the coating is carried out by means of hot air or a dryer using far infrared rays or near infrared rays at a temperature of 50 to 120° C., preferably 60 to 100° C., for a period of 10 to 60 minutes.

The thickness of the dry film is in the range of 5 to 100 μm, preferably 10 to 50 μm. When the film thickness is not less than 5 μm, insulation reliability can be obtained without any trouble. When the film thickness is not more than 10 µm, resolution can be improved.

The dry film is laminated onto a circuit surface of FPC or the like and thermally pressure bonded at a pressure of 0.2 to 3 MPa under heating at a temperature of 40 to 150° C., preferably 40 to 120° C., more preferably 60 to 100° C., by a known method such as plane pressure bonding or roller pressure bonding, whereby a photosensitive coating film can be formed. By setting the thermal pressure bonding-possible temperature to not lower than 400° C., alignment operation before pressure bonding is free from troubles attributable to tack. By setting the temperature to not higher than 150° C., imidation does not proceed too rapidly and there is enough time for the bonding, whereby a process margin can be widely taken. The thermal pressure bonding-possible temperature means a temperature at which a problem of remaining of bubble does not occur, embedding of the film into the pattern can be sufficiently made, and the film can be controlled so as to have such a viscosity that the resin does not flow out of the pattern.

The viscosity at the temperature for the pressure bonding of the dry film is desired to be in the range of 50 to 50000 Pa·s, preferably 100 to 5000 Pa·s. By adjusting the Viscosity to not less than 50 Pa·s, flow out can be presented in the pressure bonding. By adjusting the Viscosity to not more than 50000 Pa·s, good embedding properties into the pattern can be obtained The viscosity at the temperature for the pressure bonding of the dry film is measured as follows. The dry film is sandwiched between parallel plates in such a manner that the film thickness becomes 0.5 to 1.0 mm, and shear stress is applied to the film at a frequency of 0.5 Hz with elevating the temperature, to measure the viscosity by the use of a HAAKE rheometer In order to form extremely fine holes and extremely small width lines, the photosensitive coating film is exposed to light through a photo mask having an arbitrary pattern drawn thereon. Although the exposure light quantity varies depending upon the formulation of the photosensitive resin composition, it is usually in the range of 100 to 1000 mJ/cm$^2$. Examples of the active lights used herein include electron rays, ultraviolet rays and X rays. Of these, preferable are ultraviolet rays. As the light source, a low-pressure mercury lamp, a high-pressure mercury lamp, an extra-high-pressure mercury lamp, a halogen lamp or the like is employable.

After the exposure, development is carried out using a developing solution by, for example, an immersion method or a spraying method. As the developing solution, an alkali aqueous solution such as a sodium hydroxide aqueous solution or a sodium carbonate aqueous solution is employable. After the development, it is preferable to carry out rinsing with a dilute acid aqueous solution such as dilute hydrochloric acid or dilute sulfuric acid to give amic acid. By carrying out rinsing, lowering of the imidation ratio can be inhibited.

The pattern obtained by the development is then subjected to heat treatment to perform polyimidation. The heat treatment is continuously or stepwise carried out at a temperature of 150 to 450° C., preferably 200 to 300° C., for a period of 0.1 to 5 hours. Thus, a workpiece can be produced.

Examples of the workpieces obtained as above include flexible circuit boards and multi-layer printed circuit boards.

Effect of the Invention

The photosensitive resin composition according to the invention is capable of forming a solder resist dry film, which can be developed with an alkali aqueous solution such as a sodium hydroxide aqueous solution or a sodium carbonate aqueous solution, is curable with low energy, has fine resolution and exhibits excellent heat resistance, flame resistance, adhesion and electrical properties with retaining good flexibility and flexing properties.

The dry film according to the invention can be developed with an alkali aqueous solution and has excellent heat resistance, flame resistance, adhesion and electrical properties with retaining good flexibility and flexing properties. Further, the dry film can be preferably used as a cover-lay material that is curable with low energy and requires fine resolution The workpiece according to the invention, such as a flexible circuit board or a multi-layer printed circuit board, has a solder resist coating film which has excellent heat resistance, flame resistance, adhesion and electrical properties with retaining good flexibility and flexing properties.

EXAMPLE

The present invention is further described with reference to the following examples, but it should be construed that the invention is in no way limited to those examples.

Synthesis Example 1

Synthesis of Polyamic Acid Solution (PA1)

In a reactor (equipped with a stirrer, a reflux condenser and a nitrogen feed pipe), 151.0 g (0.517 mol) of 1,3-bis(3-aminophenoxy)benzene was dissolved in 350 g of N,N-dimethylacetamide and 350 g of diethylene glycol dimethyl ether in a nitrogen atmosphere, and with stirring, to the solution was added 149.0 g (0.507 mol) (molar ratio: 0.981) of 3,3',4,4'-biphenyltetracarboxylic dianhydride (in the form of dry solids) by portions. During the addition, the reaction temperature was maintained at 25 to 30° C., and after the addition, stirring was continued for 20 hours in a nitrogen atmosphere to obtain a polyamic acid solution (PA1) having a solids content of 30% by weight.

Synthesis Example 2

Synthesis of Polyamic Acid Solution (PA2)

A polyamic acid solution (PA2) was obtained by conducting reaction in the same molar ratio (0.981) under the same reaction conditions as in Synthesis Example 1, except that pyromellitic dianhydride was used instead of 3,3',4,4'-biphenyltetracarboxylic dianhydride.

Synthesis Example 3

Synthesis of Polyamic Acid Solution (PA3)

A polyamic acid solution (PA3) was obtained by conducting reaction in the same molar ratio (0.981) under the same reaction conditions as in Synthesis Example 1, except that 4,4'-bis(3-aminophenoxy)biphenyl was used instead of 1,3-bis(3-aminophenoxy)benzene.

Synthesis Example 4

Synthesis of Polyamic Acid Solution (PA4)

A polyamic acid solution (PA4) was obtained by conducting reaction in the same molar ratio (0.981) under the same reaction conditions as in Synthesis Example 3, except that pyromellitic dianhydride was used instead of 3,3',4,4'-biphenyltetracarboxylic dianhydride.

Synthesis Example 5

Synthesis of Polyamic Acid Solution (PA5)

A polyamic acid solution (PA5) was obtained by conducting reaction under the same reaction conditions as in Synthesis Example 2, except that the amount of 1,3-bis(3-aminophenoxy)benzene was changed 176.7 g (0.605 mol) and the amount of pyromellitic dianhydride was changed to 123.3 g (0.566 mol) (molar ratio: 0.936)

Synthesis Example 6

Synthesis of Polyamic Acid Solution (PA6)

A polyamic acid solution (PA6) was obtained by conducting reaction under the same reaction conditions as in Synthesis Example 2, except that the amount of 1,3-bis(3-aminophenoxy)benzene was changed to 172.2 g (0.590 mol) and the amount of pyromellitic dianhydride was changed to 127.8 g (0.586 mol) (molar ratio: 0.933).

Synthesis Example 7

Synthesis or Polyamic Acid Solution (PA-7)

A polyamic acid solution (PA7) was obtained by conducting reaction under the same reaction conditions as in Synthesis Example 1, except that 122.9 g (0.6145 mol) of 3,3'-diaminodiphenyl ether was used instead of 1,3-bis(3-aminophenoxy)benzene and the amount of 3,3',4,4'-biphenyltetracarboxylic dianhydride was changed to 177.1 g (0.6024 mol) (molar ratio: 0.980).

Synthesis Example 8

Synthesis of Polyamic Acid Solution (PA8)

A polyamic acid solution (PA8) was obtained by conducting reaction under the same reaction conditions as in Synthesis Example 1, except that 161.5 g (0.4389 mol) of 4,4'-bis(3-aminophenoxy)biphenyl was used instead of 1,3-bis(3-aminophenoxy)benzene and 138.5 g (0.4301 mol) (molar ratio: 0.980C) of 3,4,3',4'-benzophenonetetracarboxylic dianhydride was used instead of 3,3',4,4'-biphenyltetracarboxylic dianhydride Dielectric constants of the amic acid units of the polyamic acids synthesized in the above synthesis examples, logarithmic viscosities (η) of the polyamic acid solutions, etc. are set forth in Table 1 and Table 2.

Synthesis Example 9

Synthesis of Flame Retardant (FR-1)

In a separable flack, 500.0 g of R-140 (trade name, bisphenol A diglycidyl ether available from Mitsui Chemicals, Inc., epoxy equivalent: 185 g/eq), 611.7 g of HCA (trade name, 9,10-dihydro-9-oxa-10-phosphaphenanthrene-10-oxide available from Sanko, active hydrogen equivalent: 215 g/eq) and 300 g of dimethylacetamide (DMAc) were placed, and they were heated up to 120° C. After the mixture was confirmed to be homogeneous, a solution of TPP (triphenylphosphine) in xylene was added in such an amount that the amount of TPP became 500 ppm based on the reaction mixture. Immediately, the internal temperature was elevated up to 150° C., and the reaction was conducted for 5 hours. After the reaction was completed, the reaction solution was diluted with DMAc little by little to give a solution of 60% concentration (FR-1). The elemental analysis of the reaction product resulted in a phosphorus content of 7.5% by weight.

Synthesis Example 10

Synthesis of Flame Retardant (FR-2)

In a separable flask, 500.0 g of Denacol EX-141 (trade name, phenyl glycidyl ether available from Nagese Chemtex, epoxy equivalent: 141 g/eq), 604.7 g of HCA-HQ (trade name, 9,10-dihydro-9-oxa-10-(2,5-dihydroxyphenyl)phosphaphenanthrene-10-oxide available from Sanko, active hydrogen equivalent: 162 g/eq) and 300 g of dimethylacetamide (DMAc) were placed, and they were heated up to 120° C. After the mixture was confirmed to be homogeneous, a solution of TPP (triphenylphosphine) in xylene was added in such an amount that the amount of TPP became 500 ppm based on the reaction mixture. Immediately, the internal temperature was elevated up to 150° C., and the reaction was conducted for 5 hours. After the reaction was completed, the reaction solution was diluted with DMAc little by little to give a solution of 60% concentration (FR-2). The elemental analysis of the reaction product resulted in a phosphorus content of 2.8% by weight.

Synthesis Example 11

Synthesis of Flame Retardant (FR-3)

In a separable flask, 500.0 g of V#169 (trade name, benzyl acrylate available from Osaka Yuki Kagaku Kogyo), 454.5 g of diphenylphosphinyl hydroquinone (available from Wako Junyaku Kogyo, active hydrogen equivalent: 310 g/eq) and 300 g of dimethylacetamide (DMAc) were placed, and they were heated up to 120° C. After the mixture was confirmed to be homogeneous, a solution of TPP (triphenylphosphine) in xylene was added in such an amount that the amount of TPP became 500 ppm based on the reaction mixture. Immediately, the internal temperature was elevated up to 150° C., and the reaction was conducted for 5 hours. After the reaction was completed, the reaction solution was diluted with DMAc little by little to give a solution of 60% concentration (FR-3). The elemental analysis of the reaction product resulted in a phosphorus content of 3.2% by weight.

TABLE 1

| Synthetic example | Polyamic acid solution | Diamine compound | Tetracarboxylic dianhydride | Dielectric constant |
|---|---|---|---|---|
| 1 | PA1 | H2N-(phenyl)-O-(phenyl)-O-(phenyl)-NH2 | biphenyltetracarboxylic dianhydride structure | 4.24 |

TABLE 1-continued

| Synthetic example | Polyamic acid solution | Diamine compound | Tetracarboxylic dianhydride | Dielectric constant |
|---|---|---|---|---|
| 2 | PA2 | H₂N–C₆H₄–O–C₆H₄–O–C₆H₄–NH₂ | pyromellitic dianhydride | 4.56 |
| 3 | PA3 | H₂N–C₆H₄–O–C₆H₄–C₆H₄–O–C₆H₄–NH₂ | 3,3',4,4'-biphthalic dianhydride | 4.01 |
| 4 | PA4 | H₂N–C₆H₄–O–C₆H₄–C₆H₄–O–C₆H₄–NH₂ | pyromellitic dianhydride | 4.23 |
| 5 | PA5 | H₂N–C₆H₄–O–C₆H₄–O–C₆H₄–NH₂ | pyromellitic dianhydride | 4.56 |
| 6 | PA6 | H₂N–C₆H₄–O–C₆H₄–O–C₆H₄–NH₂ | pyromellitic dianhydride | 4.56 |
| 7 | PA7 | H₂N–C₆H₄–O–C₆H₄–NH₂ | 3,3',4,4'-biphthalic dianhydride | 4.58 |
| 8 | PA8 | H₂N–C₆H₄–O–C₆H₄–C₆H₄–O–C₆H₄–NH₂ | benzophenone tetracarboxylic dianhydride | 3.98 |

TABLE 2

| Synthetic example | Polyamic acid solution | Amic acid content | Molar ratio | η (Pa · s) |
|---|---|---|---|---|
| 1 | PA1 | 30.3 | 0.981 | 14.5 |
| 2 | PA2 | 34.5 | 0.981 | 8.2 |
| 3 | PA3 | 26.8 | 0.980 | 17.3 |
| 4 | PA4 | 30.0 | 0.980 | 13.4 |
| 5 | PA5 | 34.5 | 0.936 | 0.8 |
| 6 | PA6 | 34.5 | 0.993 | 25.8 |
| 7 | PA7 | 38.6 | 0.980 | 10.1 |
| 8 | PA8 | 25.5 | 0.980 | 18.8 |

Examples of photosensitive resin compositions using the amic acid solutions and the flame retardants synthesized in the above synthesis examples are given below.

Example 1

200 Parts by weight of the amic acid solution (PA1) obtained in Synthesis Example 1, 30 parts by weight of pentaerythritol triacryalte (available from Toa Gosei, trade name: Aronics M-305) as an acrylate, 20 parts by weight of polyethylene glycol diacrylate (available from Shinnakamura Kagaku Kogyo, trade name: NKA-200) as an acrylate and 13.3 parts by weight (Br content: 7.0% by weight) of BS-31 (trade name, available from Daiichi Kogyo Seiyaku, Br content: 67.2% by weight) as a flame retardant were mixed. To the mixture, 2.5 parts by weight of IRGACURE 907 (trade name, available from Ciba-Geigy Corporation, referred to as "IRC907" hereinafter) and 1.5 parts by weight of Kayacure DETX (trade name, available from Nippon Kayaku, referred to as "DETX" hereinafter) were added as photopolymerization initiators to prepare a varnish. The varnish was applied onto a polypropylene film (carrier film) having a width of 30 cm and a thickness of 20 µm in a coating thickness of about 100 µm, then dried in a circulating hot air oven at 80° C. for 30 minutes and laminated with a cover film having a thickness of 20 µm to prepare a dry film. After peeling off the cover film, the dry film was superposed on FPC having a pattern formed thereon or on a shiny side of a 1 oz rolled copper foil, subjected to alignment, then pressure bonded by a vacuum laminating device at 80° C. for 20 seconds and thermally cured at 250° C. for 10 minutes to prepare a test piece for evaluation Examples 2–17

Varnishes were prepared in the same manner as in Example 1, except that the compounding ratios shown in Table 3 and Table 4 were used. Then, in the same manner as in Example 1, dry films were formed from the varnishes and test pieces were prepared using the dry films.

Comparative Example 1

A varnish was prepared in the same manner as in Example 1, except that the compounding ratio shown in Table 4 was used. Then, in the same manner as in Example 1, a dry film was formed from the varnish and a test piece was prepared using the dry film.

The test pieces prepared in the examples and the comparative example were evaluated on the following items.

Evaluation 1 (Compatibility)

The amic acid solution and an acrylate were mixed in a weight ratio of 100/100, and whether the mixture became turbid or not was examined.

Evaluation 2 (Resolution)

The test piece was exposed to light at 300 mJ/cm$^2$, developed by spraying a 1.0% $Na_2CO_3$ aqueous solution at 300° C. under a pressure of 0.15 Pa, then neutralized with a 0.5% $H_2SO_4$ aqueous solution and cured. Then, whether a via hole having a diameter of 100 µm could be resolved or not was examined.

Evaluation 3 (Crosscut Peel)

The crosscut peel was evaluated in accordance with JIS K 5404.

Evaluation 4 (Solvent Resistance Test)

The test piece was immersed in isopropyl alcohol (designated in JIS K 8839) at room temperature for 24 hours. Then, peeling, discoloration, etc. of the test piece were examined (JPCA-BM02).

Evaluation 5 (Chemical Resistance A)

The test piece was immersed in 10% hydrochloric acid at room temperature for 30 minutes. Then, peeling, discoloration, etc. of the test piece were examined (in accordance with JPCA-BM02).

Evaluation 6 (Chemical Resistance B)

The test piece was immersed in 10% sodium hydroxide at room temperature for 30 minutes. Then, peeling, discoloration, etc. of the test piece were examined (in accordance with JPCA-BM02).

Evaluation 7 (Solder Blister)

On a molten solder maintained at 260±5° C., the test piece was floated with its cover-lay side upside for 5 seconds, and blister of the coating film was examined (in accordance with JPCA-BM02).

Evaluation 8 (Flexing Resistance Test)

A double-sided board was flexed at 180° and a load of 1 kg was applied to the flexed portion. This operation was repeated three times, and peeling at the flexed portion was observed by an optical microscope.

Evaluations 9 and 10 (Tensile Strength and Elongation)

A cured film having a thickness of 30 to 35 µm, a width of 15 mm and a length of 150 mm was prepared and subjected to a tensile test at a pulling rate of 50 mm/min to measure strength and elongation.

Evaluation 11 (Tg)

A cured film having a thickness of 30 to 35 µm, a width of 4 mm and a length of 25 mm was prepared, and Tg of the film was measured by Seiko Electron TMA/SS100 at a heating rate of 2° C./min under a tensile mode load of 5 g.

Evaluation 12 (Flame Retardance)

The flame retardance was evaluated by a vertical firing test of UL method (subject 94).

The compositions of Examples 1 to 10 are set forth in Table 3, the compositions of Examples 11 to 17 and Comparative Example 1 are set forth in Table 4, and the evaluation results are set forth in Tables 5 to 7.

In Tables 3 and 4, "Aronics M-215" and "A-BPE-10" mean the following compounds.

Aronics M-215: isocyanuric acid monoethylene glycol diacrylate

A-BPE-10: ethylene oxide 10 mol addition product of bisphenol A diacrylate.

TABLE 3

|  | Examples | | | | | | | | |
|---|---|---|---|---|---|---|---|---|---|
|  | 1 | 2 | 3 | 4 | 5 | 6 | 7 | 8 | 9 |
| PA-1 | 200 | | | | | | | | |
| PA-2 | | 200 | | | | | | | |
| PA-3 | | | 200 | | | | | | |
| PA-4 | | | | 200 | | | | | |
| PA-5 | | | | | 200 | | | | |
| PA-6 | | | | | | 200 | | | |
| PA-7 | | | | | | | 200 | | |
| PA-8 | | | | | | | | 200 | |
| Aronics M-215 | | | | | | | | | 20 |
| NKA-200 | 20 | 20 | 20 | 20 | 20 | 20 | 20 | 20 | |
| Aronics M-305 | 30 | 30 | 30 | 30 | 30 | 30 | 30 | 30 | |
| A-BPE-10 | | | | | | | | | 30 |
| FR-1 | | | | | | | | | |
| FR-2 | | | | | | | | | |
| FR-3 | | | | | | | | | |
| BR-31 | 13.3 | 13.3 | 13.3 | 13.3 | 13.3 | 13.3 | 13.3 | 13.3 | 13.3 |
| IRC907 | 2.5 | 2.5 | 2.5 | 2.5 | 2.5 | 2.5 | 2.5 | 2.5 | 2.5 |
| DETX | 1.5 | 1.5 | 1.5 | 1.5 | 1.5 | 1.5 | 1.5 | 1.5 | 1.5 |
| P content (%) | | | | | | | | | |
| Br content (%) | 7.0 | 7.0 | 7.0 | 7.0 | 7.0 | 7.0 | 7.0 | 7.0 | 7.0 |

TABLE 4

|  | Example | | | | | | | | Compar. Example |
|---|---|---|---|---|---|---|---|---|---|
|  | 10 | 11 | 12 | 13 | 14 | 15 | 16 | 17 | 1 |
| PA-1 | 200 | 200 | | | | | 200 | | 200 |
| PA-2 | | | 200 | 200 | 200 | | | | |
| PA-3 | | | | | | | | 200 | |
| PA-4 | | | | | | 200 | | | |
| PA-5 | | | | | | | | | |
| PA-6 | | | | | | | | | |
| PA-7 | | | | | | | | | |
| PA-8 | | | | | | | | | |
| Aronic M-215 | | | 20 | 20 | 20 | 20 | 20 | 20 | 20 |
| NKA-200 | 12 | 120 | 20 | 20 | 20 | 20 | 20 | 20 | 20 |
| Aronics M-305 | 6 | 60 | | | | | | | |
| A-BPE-10 | | | 20 | 20 | 20 | 20 | 20 | 20 | 20 |
| FR-1 | | | 30 | | | 30 | 30 | 30 | 30 |
| FR-2 | | | | 66.6 | | | | | |
| FR-3 | | | | | 54.6 | | | | |
| BR-31 | 9.4 | 28.7 | | | | | | | |
| IRC907 | 1.5 | 4.0 | 5.0 | 5.0 | 5.0 | 5.0 | 5.0 | 5.0 | 5.0 |
| DETX | 1.5 | 2.5 | 3.0 | 3.0 | 3.0 | 3.0 | 3.0 | 3.0 | 3.0 |
| P content (%) | | 0.0 | 1.5 | 1.0 | 1.0 | 1.5 | 1.5 | 1.5 | 0.0 |
| Br content (%) | 7.0 | 7.0 | 0.0 | 0.0 | 0.0 | 0.0 | 0.0 | 0.0 | 0.0 |

TABLE 5

|  | Example | | | | | |
|---|---|---|---|---|---|---|
|  | 1 | 2 | 3 | 4 | 5 | 6 |
| Evaluation 1 | Not turbid | Not turbid | Not turbid | Not turbid | Not turbid | Not turbid |
| Evaluation 2 | 100≧ | 100≧ | 100≧ | 100≧ | 100≧ | 100≧ |
| Evaluation 3 | 100/100 | 100/100 | 100/100 | 100/100 | 100/100 | 100/100 |
| Evaluation 4 | Pass | Pass | Pass | Pass | Pass | Pass |
| Evaluation 5 | Pass | Pass | Pass | Pass | Pass | Pass |
| Evaluation 6 | Pass | Pass | Pass | Pass | Pass | Pass |
| Evaluation 7 | Pass | Pass | Pass | Pass | Pass | Pass |
| Evaluation 8 | Pass | Pass | Pass | Pass | Pass | Pass |
| Evaluation 9 (MPa) | 111.5 | 106.4 | 118.7 | 113.9 | 94.3 | 126.1 |
| Evaluation 10 (%) | 16.3 | 15.2 | 14.4 | 19.1 | 13.3 | 21.8 |

TABLE 5-continued

|  | Example | | | | | |
|---|---|---|---|---|---|---|
|  | 1 | 2 | 3 | 4 | 5 | 6 |
| Evaluation 11 (° C.) | 176 | 181 | 208 | 223 | 162 | 168 |
| Evaluation 12 | V-0 | V-0 | V-0 | V-0 | V-0 | V-0 |

TABLE 6

|  | Example | | | | | |
|---|---|---|---|---|---|---|
|  | 7 | 8 | 9 | 10 | 11 | 12 |
| Evaluation 1 | Not turbid | Not turbid | Not turbid | Not turbid | Not turbid | Not turbid |

TABLE 6-continued

| | Example | | | | | |
|---|---|---|---|---|---|---|
| | 7 | 8 | 9 | 10 | 11 | 12 |
| Evaluation 2 | 100≧ | 100≧ | 100≧ | 100≧ | 100≧ | 100≧ |
| Evaluation 3 | 100/100 | 100/100 | 100/100 | 100/100 | 100/100 | 100/100 |
| Evaluation 4 | Pass | Pass | Pass | Pass | Pass | Pass |
| Evaluation 5 | Pass | Pass | Pass | Pass | Pass | Pass |
| Evaluation 6 | Pass | Pass | Pass | Pass | Pass | Pass |
| Evaluation 7 | Pass | Pass | Pass | Pass | Pass | Pass |
| Evaluation 8 | Pass | Pass | Pass | Pass | Pass | Pass |
| Evaluation 9 (MPa) | 133.5 | 121.5 | 132.5 | 96.6 | 88.6 | 88.6 |
| Evaluation 10 (%) | 13.7 | 13.8 | 14.4 | 12.4 | 30.3 | 46.8 |
| Evaluation 11 (° C.) | 203 | 182 | 162 | 184 | 155 | 158 |
| Evaluation 12 | V-0 | V-0 | V-0 | V-0 | V-0 | V-0 |

TABLE 7

| | Example | | | | | Compar. Example |
|---|---|---|---|---|---|---|
| | 13 | 14 | 15 | 16 | 17 | 1 |
| Evaluation 1 | Not turbid | Not turbid | Not turbid | Not turbid | Not turbid | Not turbid |
| Evaluation 2 | 100≧ | 100≧ | 100≧ | 100≧ | 100≧ | 100< |
| Evaluation 3 | 100/100 | 100/100 | 100/100 | 100/100 | 100/100 | 100/100 |
| Evaluation 4 | Pass | Pass | Pass | Pass | Pass | Pass |
| Evaluation 5 | Pass | Pass | Pass | Pass | Pass | Pass |
| Evaluation 6 | Pass | Pass | Pass | Pass | Pass | Pass |
| Evaluation 7 | Pass | Pass | Pass | Pass | Pass | Pass |
| Evaluation 8 | Pass | Pass | Pass | Pass | Pass | Pass |
| Evaluation 9 (MPa) | 73.5 | 74.1 | 96.4 | 88.8 | 101.3 | 68.6 |
| Evaluation 10 (%) | 28.6 | 33.9 | 48.9 | 41.3 | 55.2 | 44.2 |
| Evaluation 11 (° C.) | 169 | 181 | 176 | 223 | 208 | 172 |
| Evaluation 12 | V-0 | V-0 | V-0 | V-0 | V-0 | V-2out |

What is claimed is:

1. A photosensitive resin composition comprising:

(A) a polyamic acid, (B) a (meth)acrylate having at least two photopolymerizable C=C unsaturated double bonds, (C) a photopolymerization initiator, and (D) a flame retardant, wherein the (meth)acrylate (B) having at least two photopolymerizable C=C unsaturated double bonds is contained in an amount of 10 to 700 parts by weight based on 100 parts by weight of the polyamic acid (A), and wherein the flame retardant (D) is an addition product of an organic phosphorus compound represented by the following formula (4), (5) or (6):

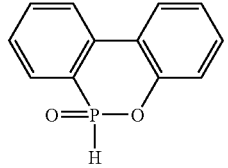

(4)

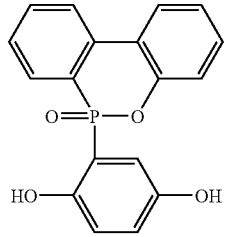

(5)

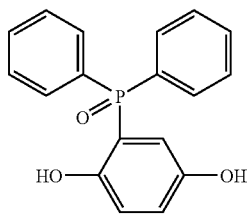

(6)

with at least one compound selected from a compound having 1 to 4 epoxy groups, a compound having 1 to 4 (meth)acrylic groups or a compound having 1 to 4 vinyl groups.

2. The photosensitive resin composition as claimed in claim 1, wherein the (meth)acrylate (B) having at least two photopolymerizable C=C unsaturated double bonds comprises a bi- or more-functional (meth)acrylate compound having an alcoholic hydroxyl group and a polyalkylene glycol di(meth)acrylate compound, and based on 100 parts by weight of the polyamic acid (A), the bi- or more-functional (meth)acrylate compound having an alcoholic hydroxyl group is contained in an amount of 5 to 200 parts by weight and the polyalkylene glycol di(meth)acrylate compound is contained in an amount of 10 to 500 parts by weight.

3. The photosensitive resin composition as claimed in claim 2, wherein the polyalkylene glycol di(meth)acrylate compound is a compound represented by the following formula (3):

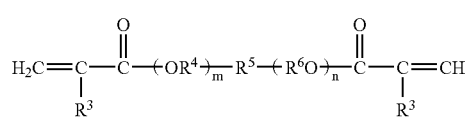

(3)

wherein $R^3$ is a hydrogen atom or a methyl group, $R^4$ and $R^6$ are each an aliphatic group of 2 to 5 carbon atoms, $R^5$ is an aromatic group having two or more benzene rings or a single bond, n and m are each an integer of 1 or greater, and n+m is 2 to 12.

4. A dry film obtained from a photosensitive resin composition comprising: (A) a polyamic acid, (B) a (meth)acrylate having at least two photopolymerizable C=C unsaturated double bonds, (C) aphotopolymerization initiator, and (D) a flame retardant, wherein the (meth) acrylate (B) having at least two photopolymerizabel C=C unsaturated double bonds is contained in an amount of 10 to 700 parts by weight based on 100 parts by weight of the polyamic acid (A), wherein the flame retardant (D) is an addition product of an organic phosphorus compound represented by the following formula (4), (5) or (6):

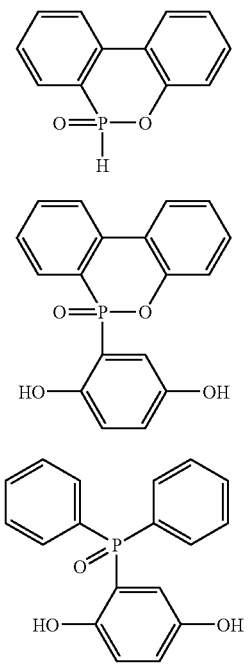

with at least one compound selected from a compound having 1 to 4 epoxy groups, a compound having 1 to 4 (meth)acrylic groups and a compound having 1 to 4 vinyl groups, and the dry film has a phosphorus content of 0.5 to 6.0 % by weight based on the weight of the dry film.

5. The dry film as claimed in claim 4, which has a viscosity, at 40 to 120° C., of 50 to 50000 Pa. S before exposure to an active light measured by the use of HAKKA rheometer.

6. A workpiece comprising a flexible printed circuit board and a polyimide coating film formed thereon, said coating film being obtained from the dry film of claim 4.

7. The photosensitive resin composition as claimed in claim 1, wherein the polyamic acid (A) comprises a constituent unit represented by the following formula (1):

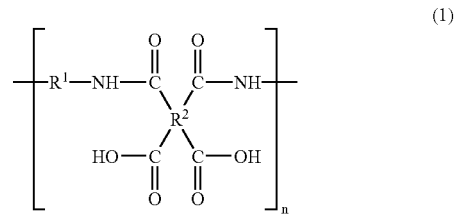

wherein n is an integer of 1 to 100, $R^1$ is a divalent organic group consisting of only elements selected from C, H and O, and $R^2$ is a tetravalent organic grop consisting of only elements selected from C, H and O, and has the following properties:

the dielectric constant, as determined by the Clausius-Mosotti's formula that is represented by the following formula (2), is in the range of 3 to 5, Dielectric constant $(\epsilon) = (1+2 \cdot Pm/Vm)/(1-Pm/Vm)$ (2)

wherein Pm is a molar polarilizability, and Vm is a solar volume, the logarithmic viscosity (solvent: N,N-dimethylacetamide, concentration: 30 % by weight, measured at 25° C.) is in the range of 0.5 to 30.0 Pa.s, and the amic acid content in the constituent units is in the range of 15 to 40° C. by weight.

* * * * *